(12) United States Patent
Chiu et al.

(10) Patent No.: US 12,211,776 B2
(45) Date of Patent: Jan. 28, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chih-Hsien Chiu, Taichung (TW); Ko-Wei Chang, Taichung (TW); Wen-Jung Tsai, Taichung (TW); Che-Wei Yu, Taichung (TW); Chia-Yang Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 263 days.

(21) Appl. No.: 17/574,944

(22) Filed: Jan. 13, 2022

(65) Prior Publication Data

US 2023/0223322 A1   Jul. 13, 2023

(30) Foreign Application Priority Data

Jun. 10, 2021 (TW) .................................. 110121187
Sep. 14, 2021 (TW) .................................. 110134239

(51) Int. Cl.
| | |
|---|---|
| H01L 23/552 | (2006.01) |
| H01L 21/48 | (2006.01) |
| H01L 23/00 | (2006.01) |
| H01L 23/31 | (2006.01) |
| H01L 23/498 | (2006.01) |
| H01L 25/00 | (2006.01) |
| H01L 25/065 | (2023.01) |

(52) U.S. Cl.
CPC .... *H01L 23/49816* (2013.01); *H01L 21/4853* (2013.01); *H01L 23/3121* (2013.01); *H01L 24/16* (2013.01); *H01L 24/81* (2013.01); *H01L 25/0657* (2013.01); *H01L 25/50* (2013.01); *H01L 24/32* (2013.01); *H01L 24/73* (2013.01); *H01L 25/0652* (2013.01); *H01L 2224/16227* (2013.01); *H01L 2224/32225* (2013.01); *H01L 2224/73204* (2013.01); *H01L 2225/06517* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 2017/0243826 A1* | 8/2017 | Lin | H01L 21/4853 |
| 2022/0223512 A1* | 7/2022 | Kuo | H01L 23/49822 |
| 2023/0044797 A1* | 2/2023 | Su | H01L 23/16 |

* cited by examiner

*Primary Examiner* — Long Pham
(74) *Attorney, Agent, or Firm* — Dority & Manning, P.A.

(57) ABSTRACT

Provided is an electronic package, in which a conductive structure and an encapsulation layer covering the conductive structure are arranged on one side of a carrier structure having a circuit layer, and an electronic component is arranged on the other side of the carrier structure. The rigidity of the carrier structure is increased by the encapsulation layer, and problems such as warpage or wavy deformations caused by increasing the volume of the electronic package due to functional requirements can be eliminated.

17 Claims, 10 Drawing Sheets

ELECTRONIC PACKAGE AND MANUFACTURING METHOD THEREOF

BACKGROUND

1. Technical Field

The present disclosure relates to a semiconductor device, and more particularly, to an electronic package and a manufacturing method thereof.

2. Description of Related Art

With the current rapid developments of end products with high-speed computations (e.g., autonomous driving, super computers or mobile devices, etc.), the sizes of chips (e.g., integrated circuits or ICs) in flip-chip ball-grid array (FCBGA) package structures and the package dimensions have also increased.

FIG. 1 is a schematic cross-sectional view of a conventional semiconductor package 1. As shown in FIG. 1, the semiconductor package 1 includes a package substrate 10, a system-on-chip (SoC) semiconductor chip 11 mounted on an upper side of the package substrate 10 by the flip-chip technique, a chip module 12 mounted on the upper side of the package substrate 10 by the flip-chip technique, and a plurality of solder balls 16 planted on a lower side of the package substrate 10. Further, an electronic component 17 (such as a capacitor) can be arranged on the lower side of the package substrate 10 according to the needs.

The volume of the conventional semiconductor package 1 has to be increased to accommodate functional requirements, and this tends to lead to problems such as warpage or wavy (wave-like) deformations. These problems are currently being addressed by some of the following approaches.

A first approach is to employ a circuit structure with a thicker core layer for the package substrate 10 to provide enough rigidity.

A second approach is to provide a metal stiffener (not shown) on the upper side of the package substrate 10 to provide additional rigidity.

A third approach involves providing at least one heat sink 13 on the upper side of the package substrate 10. For example, a top plate 130 of the heat sink 13 is disposed on a non-active face 11b of the semiconductor chip 11 via a thermal interface material (TIM) 14, and a support leg 131 of the heat sink 13 is disposed on the package substrate 10 via an adhesive layer 15.

However, the aforementioned approaches still have the following problems.

In the first approach, since the thickness of the package substrate 10 is increased, the electronic component 17 becomes further apart from the semiconductor chip 11, which leads to a degradation of the overall electrical performance of the semiconductor package 1.

In the second approach, the installation of the stiffener increases the cost of manufacturing the semiconductor package 1, and the layout area of the package substrate 10 for accommodating the stiffener has to be increased, which increases the overall size of the semiconductor package 1.

In the third approach, the heat dissipating capacity of the heat sink 13 is constrained by the heat transfer ability of the TIM 14, and the cost of manufacturing the semiconductor package 1 is also increased. On the other hand, as the rigidity of the package substrate 10 is increased by the heat sink 13, system-end cooling fins of the end product cannot be directly provided in the subsequent manufacturing processes.

Furthermore, in view of the shortcomings of the above approaches of the prior art, in some cases, the electrical and heat dissipation performance is reduced to replace the aforementioned approaches. Although by doing so, the issues just described can be prevented, but it comes with a price that the semiconductor package 1 may fail to satisfy the demands for multiple functions.

Therefore, there is a need for a solution that addresses the aforementioned issues of the prior art.

SUMMARY

In view of the aforementioned shortcomings of the prior art, the present disclosure provides an electronic package, which includes: a carrier structure having a circuit layer and including a first side and a second side opposite to the first side; conductive structures disposed on the first side of the carrier structure and electrically connected to the circuit layer; an encapsulation layer formed on the first side of the carrier structure and covering the conductive structures, wherein portions of surfaces of the conductive structures are exposed from the encapsulation layer; and at least an electronic component disposed on the second side of the carrier structure and electrically connected to the circuit layer.

In the aforementioned electronic package, each of the conductive structures includes a conductive pillar bonded to the circuit layer. For example, an end face of the conductive pillar is exposed from the encapsulation layer. Alternatively, the conductive pillar is bonded to the circuit layer via a conductor.

The aforementioned electronic package further includes a functional pad embedded in the encapsulation layer, and the functional pad is bonded to the circuit layer. For example, a portion of a surface of the functional pad is exposed from the encapsulation layer.

In the aforementioned electronic package, each of the conductive structures includes a solder ball. For example, the solder ball protrudes from the encapsulation layer.

In the aforementioned electronic package, each of the conductive structures includes a circuit block. For example, the circuit block includes at least one conductive pillar electrically connected to the circuit layer, wherein an end face of the conductive pillar is exposed from the encapsulation layer. Alternatively, the circuit block includes at least one circuit portion electrically connected to the circuit layer, wherein a portion of a surface of the circuit portion is exposed from the encapsulation layer.

The present disclosure further provides a method of manufacturing an electronic package, the method including: providing a lead frame including a board and a plurality of conductive pillars arranged at intervals on the board; disposing the lead frame on a carrier structure including a circuit layer, wherein the lead frame is bonded onto the circuit layer via the plurality of conductive pillars thereof and conductors; forming an encapsulation layer on the carrier structure to cover the plurality of conductive pillars and the conductors, wherein the board of the lead frame is exposed from the encapsulation layer; removing the board, wherein end faces of the conductive pillars are exposed from the encapsulation layer, and wherein the conductive pillars and the conductors serve as conductive structures; and disposing at least one electronic component on the carrier structure and electrically connecting the electronic component to the circuit layer.

In the aforementioned manufacturing method, the lead frame further includes a functional pad, wherein a portion of a surface of the functional pad is exposed from the encapsulation layer after the board is removed.

The present disclosure further provides a method of manufacturing an electronic package, the method including: providing a carrier structure including a circuit layer; forming a plurality of conductive structures on the circuit layer of the carrier structure; forming an encapsulation layer on the carrier structure to cover the plurality of conductive structures, wherein portions of surfaces of the conductive structures are exposed from the encapsulation layer; and disposing at least one electronic component on the carrier structure, wherein the electronic component is electrically connected to the circuit layer.

The present disclosure further provides a method of manufacturing an electronic package, the method including: providing a lead frame including a board and a plurality of conductive pillars arranged at intervals on the board; forming an encapsulation layer on the board to cover the plurality of conductive pillars; forming a carrier structure including a circuit layer on the encapsulation layer, wherein the circuit layer is electrically connected to the plurality of conductive pillars by conductors; removing the board, wherein end faces of the conductive pillars are exposed from the encapsulation layer, and wherein the conductive pillars and the conductors serve as conductive structures; and disposing at least one electronic component on the carrier structure, wherein the electronic component is electrically connected to the circuit layer.

The aforementioned electronic package and method of manufacturing an electronic package further include embedding another electronic component electrically connected to the circuit layer in the encapsulation layer.

The aforementioned electronic package and method of manufacturing an electronic package further include disposing a metal frame on a second side of the carrier structure, wherein the metal frame surrounds and covers the electronic component.

As can be understood from the above, the electronic package of the present disclosure and the manufacturing method thereof increase the rigidity of the carrier structure by the encapsulation layer, so that there is no need to provide a heat sink or a stiffener, or to increase the thickness of the carrier structure as in the prior art. This addresses the problems of warpage or wavy deformations that arise from the increased volume of the electronic package due to functional requirements. Thus, compared to the prior art, the electronic package of the present disclosure not only overcomes the problems of warpage or wavy deformations, but also improves electrical performance and heat dissipation capacity and reduces the cost of manufacturing the electronic package and the overall size of the electronic package.

BRIEF DESCRIPTION OF THE DRAWINGS

FIGS. 2A to 2D and 2E-1 are schematic cross-sectional views illustrating a method of manufacturing an electronic package in accordance with a first embodiment of the present disclosure.

FIGS. 2E-2, 2E-3 and 2E-4 are schematic cross-sectional views depicting other aspects of FIG. 2E-1.

FIG. 3 is a schematic cross-sectional view illustrating a method of manufacturing an electronic package in accordance with a second embodiment of the present disclosure.

DETAILED DESCRIPTION OF THE EMBODIMENTS

Figure 1:
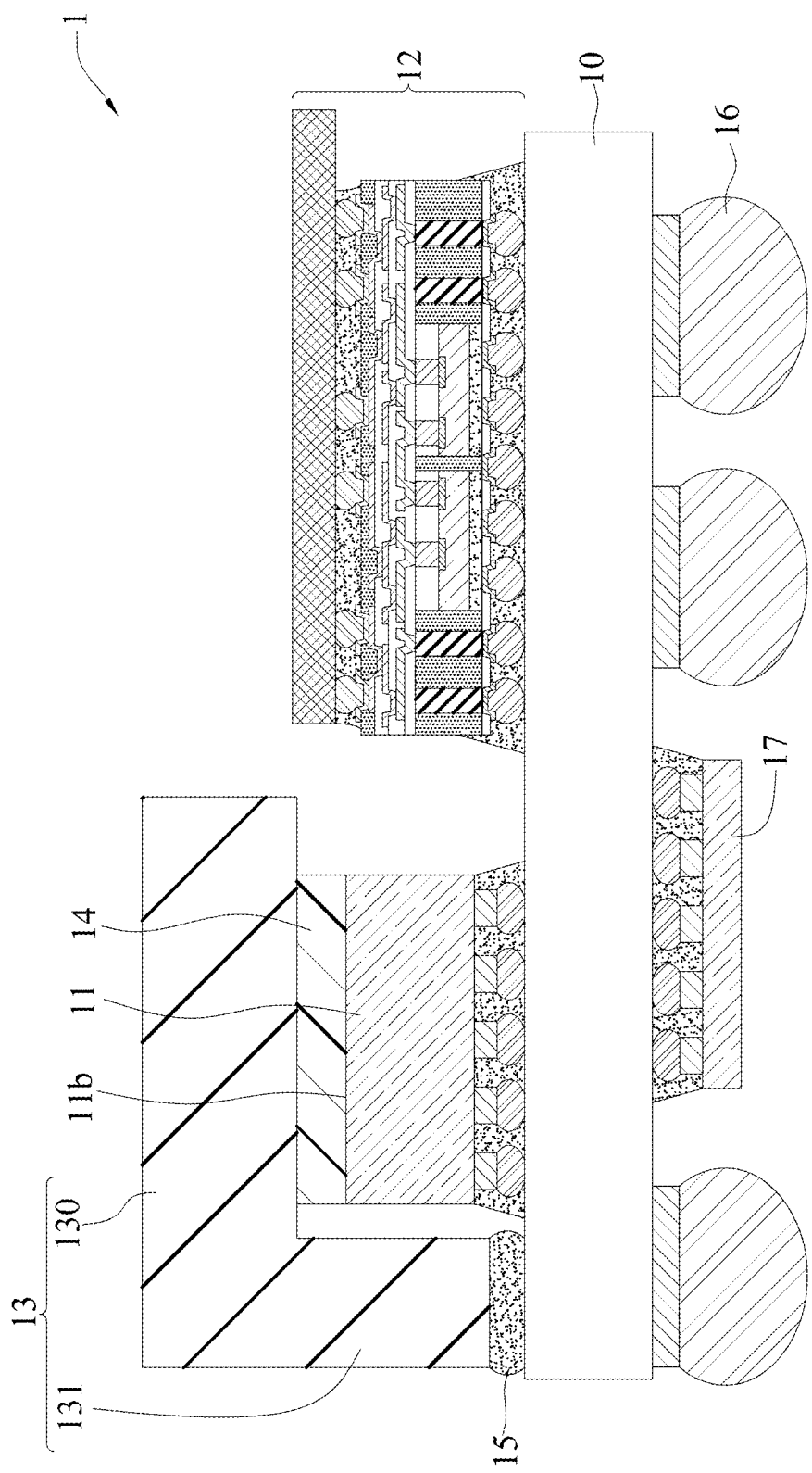
FIG. 1 is a schematic cross-sectional view of a conventional semiconductor package.

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure. Meanwhile, terms such as "above," "first," "second," "a," "an," and the like recited here are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIGS. 2A to 2E-1 are schematic cross-sectional views illustrating a method of manufacturing an electronic package 2 in accordance with a first embodiment of the present disclosure.

Figure 2A:
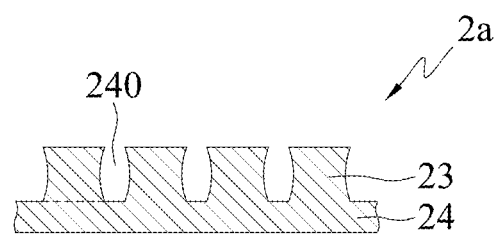

As shown in FIG. 2A, a lead frame 2a is provided and includes a board 24 and a plurality of conductive pillars 23 arranged at intervals on the board 24.

In an embodiment, the board 24 and the conductive pillars 23 are integrally formed. For example, portions of a metal board are removed by etching, laser or other methods to form the lead frame 2a formed with recesses 240 separating the various conductive pillars 23.

Figure 2B:
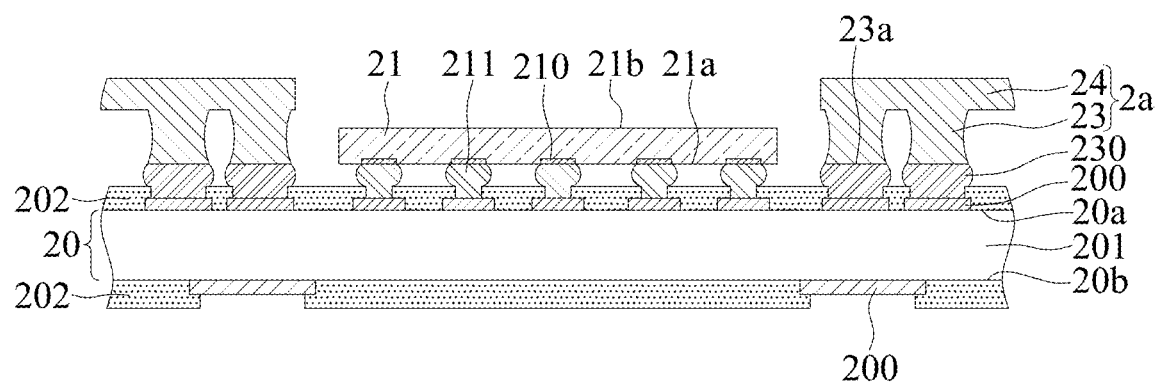

As shown in FIG. 2B, the lead frame 2a is disposed on a carrier structure 20, and at least a first electronic component 21 is disposed on the carrier structure 20.

In an embodiment, the carrier structure 20 has a first side 20a and a second side 20b opposite to each other, and the carrier structure 20 can be, for example, a package substrate with a core layer or a coreless package substrate, and includes an insulating base 201 and circuit layers 200 bonded with the insulating base 201. The circuit layers 200 are, for example, fan-out redistribution layers (RDLs). A solder resist layer 202 can be formed on the first side 20a and the second side 20b as needed, wherein circuit layers (not shown) can also arrange within the carrier structure 20 to conduct the circuit layers 200 on the first side 20a and the second side 20b. In an example, the carrier structure 20 is a package substrate with a core layer, and the material forming the circuit layers 200 is copper, whereas the material forming the insulating base 201 is a dielectric material, such as polybenzoxazole (PBO), polyimide (PI) or a prepreg (PP). It can be understood that the carrier structure 20 may also be other types of carrier units for carrying electronic components (e.g., chips), such as a lead frame or a silicon interposer, and the present disclosure is not limited as such.

Moreover, the first electronic component 21 is disposed on the first side 20a of the carrier structure 20. The first electronic component 21 can be an active component, a passive component, or a combination of both, wherein the active component is, for example, a semiconductor chip, and the passive component is, for example, a resistor, a capacitor, or an inductor. In an embodiment, the first electronic component 21 includes an active face 21a and a non-active face 21b opposite to each other. The first electronic component 21 is flip-chip mounted on and electrically connected to the circuit layer 200 via electrode pads 210 on the active face 21a thereof and a plurality of conductive bumps 211 (e.g., solder materials). Alternatively, the electrode pads 210 of the first electronic component 21 can be electrically connected to the circuit layer 200 by wire bonding via a plurality of bonding wires (not shown). As yet another alternative, the electrode pads 210 of the first electronic component 21 can be directly electrically connected to the circuit layer 200. However, the ways in which the first electronic component 21 can be electrically connected to the carrier structure 20 are not limited to those described above.

Furthermore, the lead frame 2a is bonded to the circuit layer 200 on the first side 20a of the carrier structure 20 via end faces 23a of the conductive pillars 23 thereof and conductors 230 (e.g., solder materials).

Figure 2C:
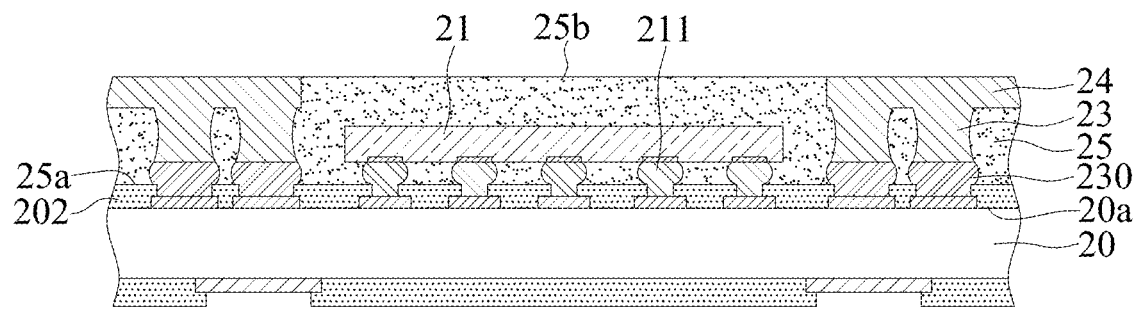

As shown in FIG. 2C, an encapsulation layer 25 is formed on the first side 20a of the carrier structure 20 to cover the first electronic component 21, the conductive pillars 23 and the conductors 230. The board 24 of the lead frame 2a is exposed from the encapsulation layer 25.

In an embodiment, the encapsulation layer 25 has a first surface 25a and a second surface 25b opposite to each other. The first surface 25a of the encapsulation layer 25 is bonded onto the first side 20a of the carrier structure 20 (or the solder resist layer 202), and the board 24 is exposed from the second surface 25b of the encapsulation layer 25. For example, a planarization process can be performed to make the second surface 25b of the encapsulation layer 25 to be flush with the surface of the board 24, such that the surface of the board 24 is exposed from the encapsulation layer 25. For instance, a polishing process can be carried out for planarization to remove portions of the encapsulation layer 25.

Moreover, the material forming the encapsulation layer 25 can be an insulating material, such as PI, a dry film, an epoxy resin, a molding compound, and the present disclosure is not limited to these. In an example, the encapsulation layer 25 is formed on the first side 20a of the carrier structure 20 by lamination or molding.

Furthermore, the encapsulation layer 25 is filled between the first electronic component 21 and the first side 20a of the carrier structure 20 to cover the conductive bumps 211. Alternatively, an underfill (not shown) can first be filled between the first electronic component 21 and the first side 20a of the carrier structure 20 to cover the conductive bumps 211, and then the underfill is covered by the encapsulation layer 25.

Figure 2D:
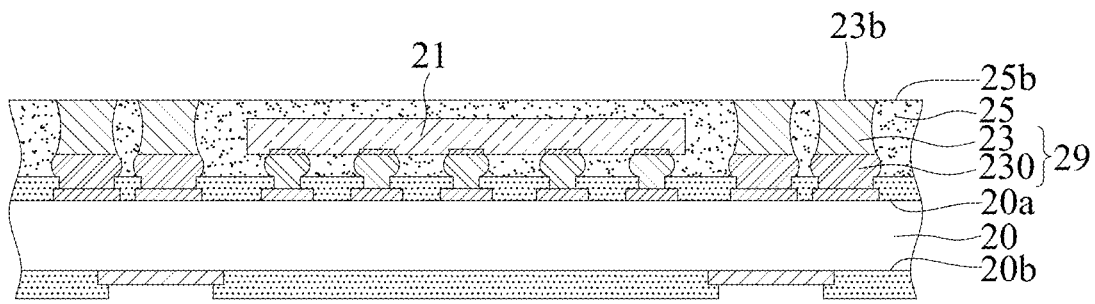

As shown in FIG. 2D, a planarization process is performed to remove the board 24 of the lead frame 2a and a portion of the encapsulation layer 25, such that the end faces 23b of the conductive pillars 23 and the second surface 25b of the encapsulation layer 25 are co-planar (i.e., at the same level), and the end faces 23b of the conductive pillars 23 are exposed from the second surface 25b of the encapsulation layer 25, wherein the conductive pillars 23 and the conductors 230 serve as conductive structures 29.

In an embodiment, the board 24 and a portion of the encapsulation layer 25 are removed by polishing, etching, searing, cutting or other appropriate methods, such that the end faces 23b of the conductive pillars 23 are exposed from the encapsulation layer 25 to be used for subsequent routing arrangements for electrical circuits.

Figures 1, 2E:
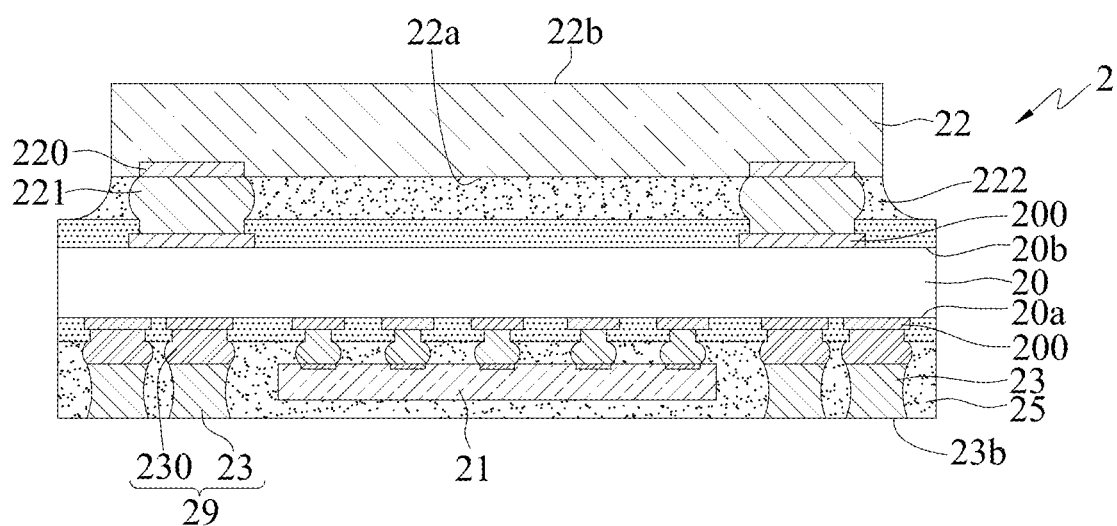

As shown in FIG. 2E-1, at least a second electronic component 22 is arranged on the second side 20b of the carrier structure 20 to obtain the desired electronic package 2.

In an embodiment, the second electronic component 22 is an active component, a passive component, or a combination of both, wherein the active component is, for example, a semiconductor chip, and the passive component is, for example, a resistor, a capacitor, or an inductor. In an embodiment, the second electronic component 22 is a system-on-chip (SoC), and includes an active face 22a and a non-active face 22b opposite to each other. The second electronic component 22 is flip-chip mounted on and electrically connected to the circuit layer 200 via electrode pads 220 on the active face 22a thereof and a plurality of conductive bumps 221 (e.g., solder materials). Then, an underfill 222 is encapsulated and formed between the second electronic component 22 and the second side 20b of the carrier structure 20 to cover the conductive bumps 221. Alternatively, the electrode pads 220 of the second electronic component 22 can be electrically connected to the circuit layer 200 by wire bonding via a plurality of bonding wires (not shown). As yet another alternative, the electrode pads 220 of the second electronic component 22 can be directly in contact with the circuit layer 200. However, the ways in which the second electronic component 22 can be electrically connected to the carrier structure 20 are not limited to those described above.

Moreover, in a subsequent manufacturing process, the electronic package 2 can be mounted onto a circuit board (not shown) via the end faces 23b of the conductive pillars 23 and solder balls (not shown).

Figures 2, 2E:
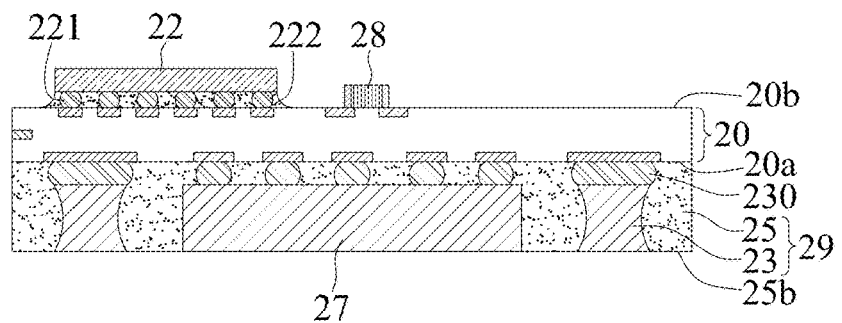

Also, in another embodiment, at least one functional pad (e-pad) 27 (replacing the first electronic component 21) connected to the circuit layer 200 via the conductors 230 can be optionally arranged on the board 24 of the lead frame 2a, as shown in FIG. 2E-2, so that after the board 24 is removed, the functional pad 27 is exposed from the second surface 25b of the encapsulation layer 25 to facilitate heat dissipation and strengthening support. Alternatively, as shown in FIG. 2E-4, the functional pad 27 can be completely embedded in the encapsulation layer 25 without exposing from the second surface 25b of the encapsulation layer 25 for heat dissipation and strengthening support so as to prevent deformation of the package.

In addition, at least a passive component 28 can be arranged on the second side 20b of the carrier structure 20 as needed.

Figures 2, 2E, 3:
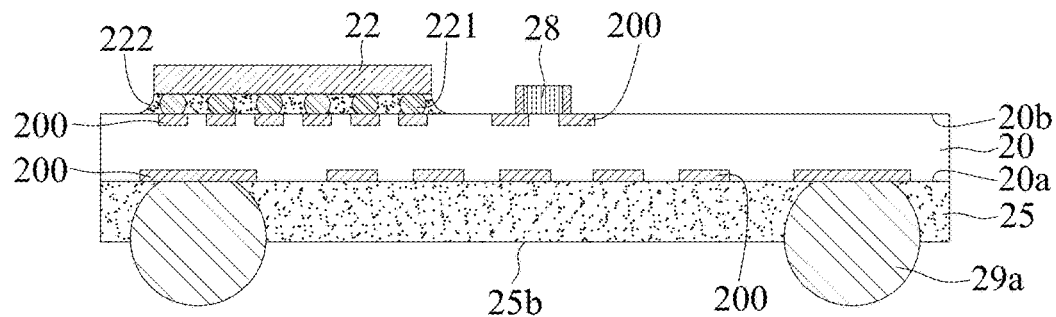
Figures 2, 2E, 3, 4:
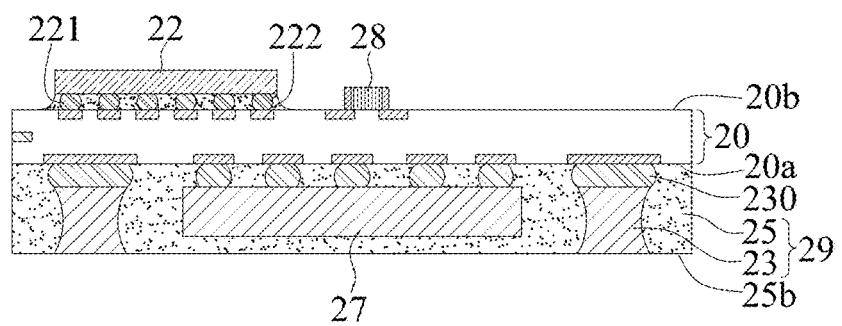
Figure 3:
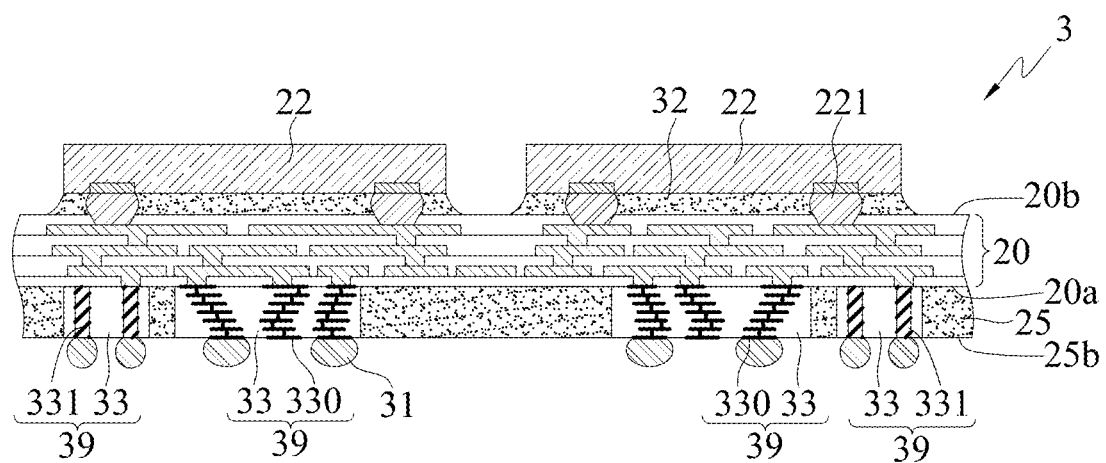

In another embodiment, as shown in FIG. 2E-3, the electronic package 2 can also employ conductive structures 29a (e.g., solder balls) instead of the lead frame 2a and the conductors 230, and the first electronic component 21 can be omitted from the first side 20a of the carrier structure 20 if needed. For example, the conductive structures 29a can protrude from the second surface 25b of the encapsulation layer 25 for connecting with an electronic device such as a circuit board (not shown).

As a result, the manufacturing method of the present disclosure increases the rigidity of the carrier structure 20 through the encapsulation layer 25, so there is no need to provide a heat sink, a stiffener or increase the thickness of the core layer of the carrier structure 20 as in the prior art. This addresses the problems of warpage or wavy deformations that arise from the increased volume of the electronic package 2 due to functional requirements. Thus, compared to the prior art, the electronic package 2 of the present disclosure not only overcomes the problems of warpage or wavy deformations, but also improves electrical performance and heat dissipation capacity and reduces the cost of manufacturing the electronic package 2 and the overall size of the electronic package 2.

FIG. 3 is a schematic cross-sectional view illustrating a method of manufacturing an electronic package 3 in accordance with a second embodiment of the present disclosure. The second embodiment differs from the first embodiment in the design of conductive structures 39, and similarities between the two will not be provided to avoid repetitions.

As shown in FIG. 3, first, in the manufacturing process illustrated in FIG. 2B, the lead frame 2a and the conductors 230 are replaced by a plurality of conductive structures 39 (e.g., circuit blocks), and the plurality of conductive structures 39 are arranged at intervals on the first side 20a of the carrier structure 20.

In an embodiment, the circuit blocks are in the form of substrates, each includes an insulating portion 33 and at least one conductive pillar 331 embedded in the insulating portion 33. In an example, the conductive pillar 331 is a metal (e.g., copper) pillar, and the material forming the insulating portion 33 can be PI, a dry film, or an encapsulant or molding compound (e.g., epoxy resin), and can be formed by lamination or molding, but the present disclosure is not limited as such.

Furthermore, in another aspect of the circuit block, circuit portions 330 can also be formed in the insulating portion 33, for example, in the form of fan-out RDLs.

It can be understood that the circuit block may also employ a semiconductor base, such as a base including, for example, silicon, glass or other appropriate materials, instead of the insulating portion 33.

Moreover, a coreless package substrate is employed as the carrier structure 20.

Then, manufacturing steps similar to those described with respect to FIGS. 2C to 2E-3 are used, and after the second electronic component 22 is provided, an underfill 32 can be filled between the second electronic component 22 and the second side 20b of the carrier structure 20 to cover the conductive bumps 221.

Furthermore, the end faces of the conductive pillars 331 of the circuit blocks or portions of the surfaces of the circuit portions 330 are exposed from the second surface 25b of the encapsulation layer 25, so as to be bonded with conductive components 31 (e.g., solder materials) for connecting with an electronic device such as a circuit board (not shown).

Therefore, the manufacturing method of the present disclosure increases the rigidity of the carrier structure 20 by the encapsulation layer 25, so there is no need to provide a heat sink, a stiffener or increase the thickness of the carrier structure 20 as in the prior art. This addresses the problems of warpage or wavy deformations that arise from the increased volume of the electronic package 3 due to functional requirements. Thus, compared to the prior art, the electronic package 3 of the present disclosure not only overcomes the problems of warpage or wavy deformations, but also improves electrical performance and heat dissipation capacity and reduces the cost of manufacturing the electronic package 3 and the overall size of the electronic package 3.

Figure 4A:
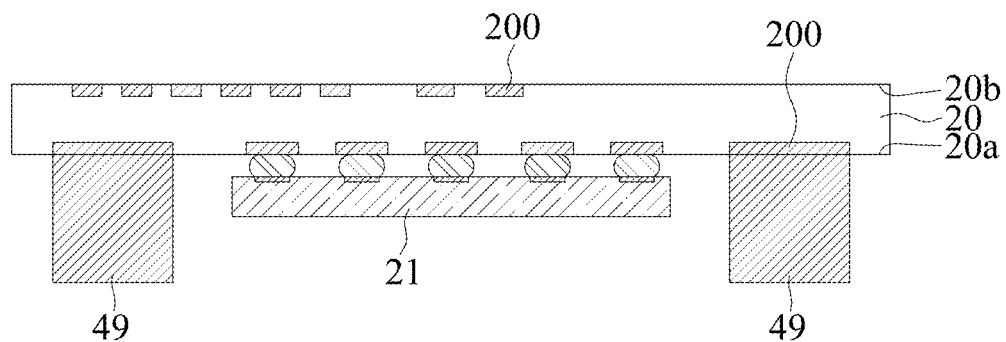
FIGS. 4A and 4B are schematic cross-sectional views illustrating a method of manufacturing an electronic package in accordance with a third embodiment of the present disclosure.
Figure 4B:
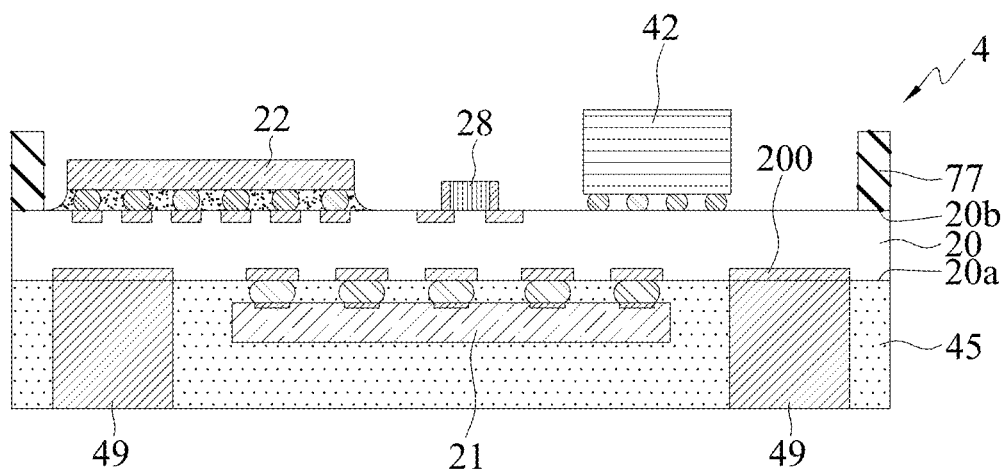

FIGS. 4A and 4B are schematic cross-sectional views illustrating a method of manufacturing an electronic package 4 in accordance with a third embodiment of the present disclosure. The third embodiment differs from the first embodiment in the design of conductive structures 49, and similarities between the two will not be provided to avoid repetitions.

As shown in FIG. 4A, the conductive structures 49 are conductive pillars that are directly formed on the circuit layer 200 on the first side 20a of the carrier structure 20 by electroplating, deposition or other methods. Thus, the heights of the conductive pillars can be adjusted according to the needs (e.g., heights are increased).

As shown in FIG. 4B, manufacturing steps similar to those described with respect to FIGS. 2C to 2E-3 are used to obtain a desired electronic package 4, where a second electronic component 42 such as a double data rate (DDR) memory module can be disposed on the second side 20b of the carrier structure 20, and a stiffener 77 such as a metal ring, a metal frame, or a non-continuous metal wall, etc., can be added according to the needs so as to reduce the overall warpage of the electronic package 4.

Therefore, the manufacturing method of the present disclosure increases the rigidity of the carrier structure 20 by the encapsulation layer 45, so there is no need to provide a heat sink, a stiffener or increase the thickness of the core layer of the carrier structure 20 as in the prior art. This addresses the problems of warpage or wavy deformations that arise from the increased volume of the electronic package 4 due to functional requirements. Thus, compared to the prior art, the electronic package 4 of the present disclosure not only overcomes the problems of warpage or wavy deformations, but also improves electrical performance and heat dissipation capacity and reduces the cost of manufacturing the electronic package 4 and the overall size of the electronic package 4.

Figure 5A:
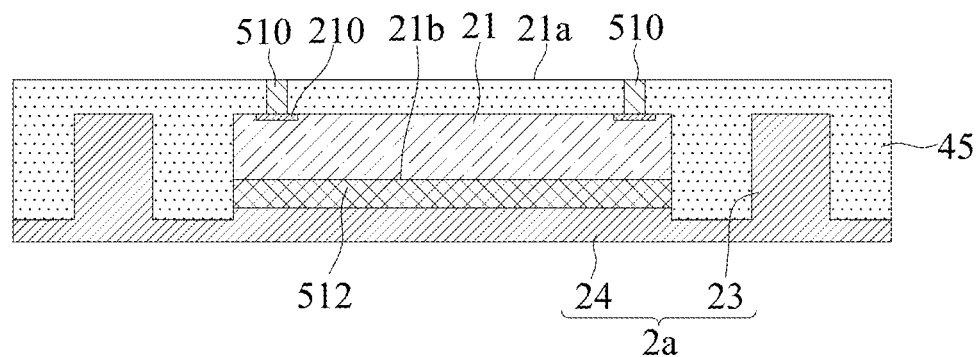
FIGS. 5A to 5C are schematic cross-sectional views illustrating a method of manufacturing an electronic package in accordance with a fourth embodiment of the present disclosure.
Figure 5B:
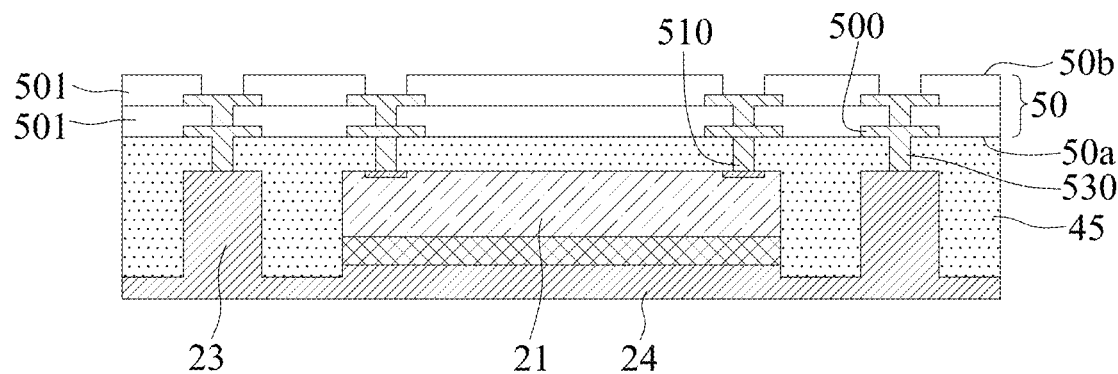
Figure 5C:
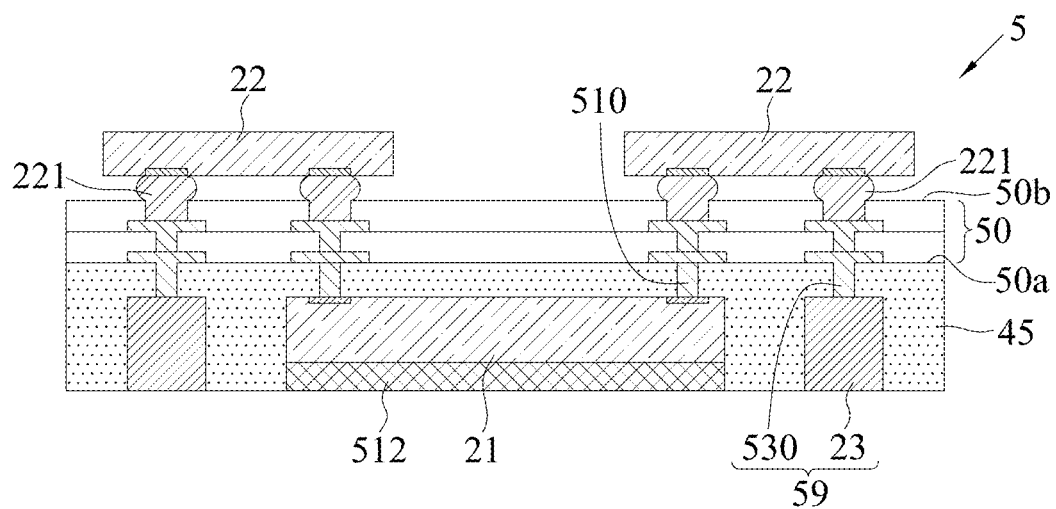

FIGS. 5A to 5C are schematic cross-sectional views illustrating a method of manufacturing an electronic package 5 in accordance with a fourth embodiment of the present disclosure. The fourth embodiment differs from the first embodiment in the order of the steps in the manufacturing process, and similarities between the two will not be provided to avoid repetitions.

As shown in FIG. 5A, first, the lead frame 2a is used as a carrier and is bonded to the first electronic component 21 by a bonding layer 512 on the board 24 of the lead frame 2a. An encapsulation layer 45 is formed on the board 24 to cover the first electronic component 21 and the conductive pillars 23.

In an embodiment, the first electronic component 21 is bonded on the board 24 via the non-active face 21b thereof and the bonding layer 512, and a plurality of conductive bumps 510 (e.g., copper pillars) can be formed on the electrode pads 210 on the active face 21a.

Moreover, the encapsulation layer 45 can be formed by lamination, so the encapsulation layer 45 covers the first electronic component 21 and the conductive pillars 23, and the conductive bumps 510 can be exposed from the encapsulation layer 45.

As shown in FIG. 5B, a circuit structure is formed on the encapsulation layer 45, such that the circuit structure is used as a carrier structure 50 having a first side 50a and a second side 50b opposite to each other. The carrier structure 50 is bonded to the encapsulation layer 45 via the first side 50a thereof.

In an embodiment, manufacturing of fan-out RDLs are directly carried out on the encapsulation layer 45 to form the circuit structure. As such, an insulating base of the carrier structure 50 includes a plurality of dielectric layers 501, and circuit layers 500 of the carrier structure 50 are electrically connected to the conductive bumps 510. During manufacturing of the circuit layers 500, portions of the circuits (i.e., conductive blind vias or metal pillars) may extend into the encapsulation layer 45 to be used as conductors 530 for electrically connecting with the conductive pillars 23.

It can be understood that if the conductive pillars 23 are in contact with the first side 50a of the carrier structure 50 (e.g., the end faces of the conductive pillars 23 are flush with the surface of the encapsulation layer 45), then the circuit layer 500 can be in contact with the conductive pillars 23 without the need to extend into the encapsulation layer 45. As such, manufacturing of the conductors 530 can be omitted.

As shown in FIG. 5C, one or a plurality of second electronic components 22 can be disposed on the second side 50b of the carrier structure 50. The board 24 is then removed to form a desired electronic package 5, wherein a conductive structure 59 includes a conductive pillar 23 and a conductor 530, and the bonding layer 512 is exposed from the encapsulation layer 45.

In an embodiment, the second electronic components 22 are SoC semiconductor chip and double data rate (DDR) memory module.

Therefore, the manufacturing method of the present disclosure increases the rigidity of the carrier structure 50 by the encapsulation layer 45, so there is no need to provide a heat sink, a stiffener or increase the thickness of the carrier structure 50 as in the prior art. This addresses the problems of warpage or wavy deformations that arise from the increased volume of the electronic package 5 due to functional requirements. Thus, compared to the prior art, the electronic package 5 of the present disclosure not only overcomes the problems of warpage or wavy deformations, but also improves electrical performance and heat dissipation capacity and reduces the cost of manufacturing the electronic package 5 and the overall size of the electronic package 5.

Figure 6A:
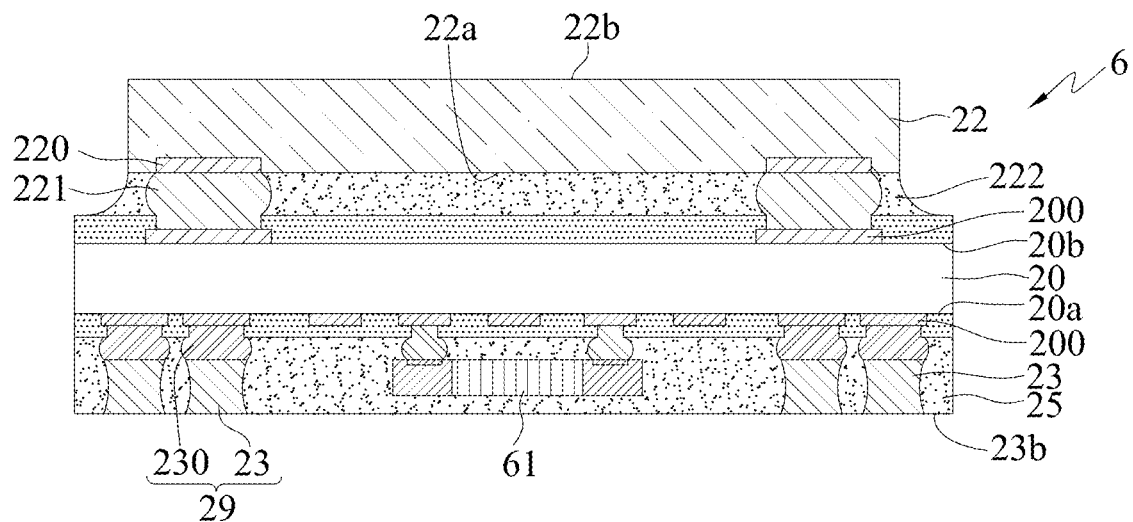
FIGS. 6A to 6C are schematic cross-sectional views illustrating a method of manufacturing an electronic package in accordance with a fifth embodiment of the present disclosure.
Figure 6B:
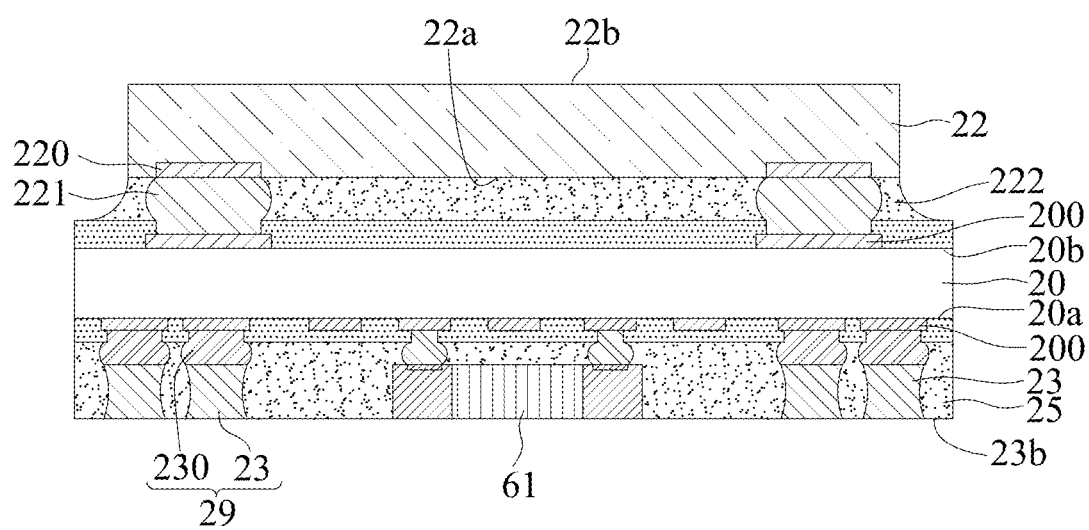
Figure 6C:
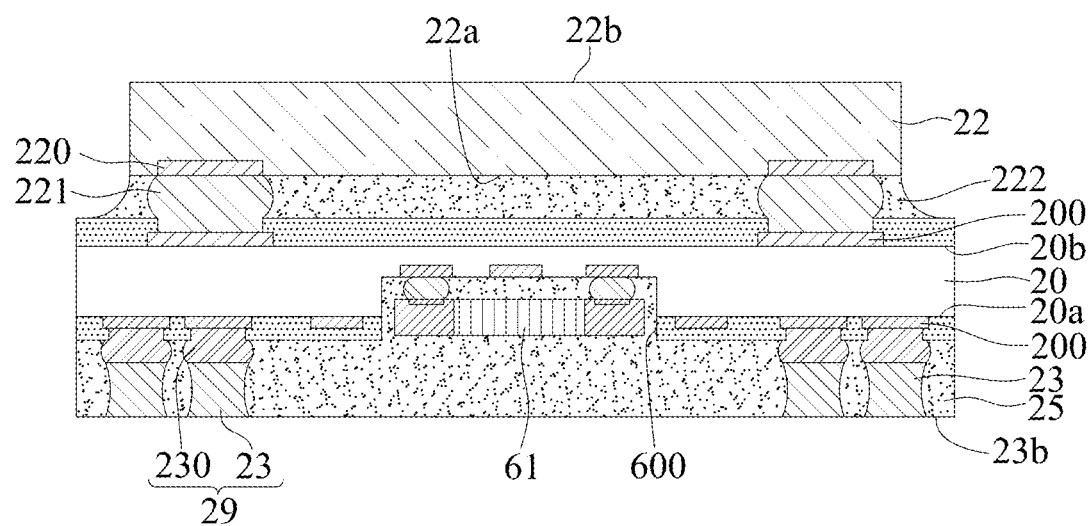

FIGS. 6A to 6C are schematic cross-sectional views illustrating a method of manufacturing an electronic package 6 in accordance with a fifth embodiment of the present disclosure. The fifth embodiment differs from the first embodiment in the design of the first electronic component, and similarities between the two will not be provided to avoid repetitions.

At present, the operating voltage of the active chip (IC) is getting lower and lower as the process shrinks, so that while the electronic product has good performance, the power consumption also increases, and the active chip is even more sensitive to noise. Since the capacitor (decoupling cap) can reduce the impedance of the power network, thereby reducing the disturbance of voltage noise to provide stable power quality, the capacitor must be placed close to the active chip to reduce parasitic inductance and achieve the optimal operation effect.

As shown in FIG. 6A, the second electronic component 22 is fixed by the underfill 222 on the second side 20b of the carrier structure 20. As such, the underfill 222 occupies the area around the second electronic component 22, so that other electronic components such as Integrated Passive Devices (IPDs) cannot get close to the second electronic component 22. Therefore, the first electronic component 61 (i.e., capacitor) such as an IPD is arranged on the first side 20a of the carrier structure 20 and correspondingly located under the second electronic component 22 (i.e., active chip), so that the first electronic component 61 can be close to the second electronic component 22 according to the needs. That is, the distance between the second electronic component 22 and the IPD (i.e., capacitor) is shortened.

In an embodiment, the first electronic component 61 can be completely embedded in the encapsulation layer 25. Alternatively, as shown in FIG. 6B, the first electronic component 61 can be exposed from the encapsulation layer 25.

Furthermore, in order to shorten the distance between the second electronic component 22 and the IPD (i.e., capacitor), a groove 600 can be formed on the first side 20a of the carrier structure 20 (as shown in FIG. 6C) to place the first electronic component 61, so that the first electronic component 61 (i.e., capacitor) can get closer to the second electronic component 22 (i.e., active chip). In addition, the thickness of the overall package can be reduced to apply in the end product and achieve the purpose of lightness, thinness and smallness.

Therefore, in this embodiment, by disposing the first electronic component 61 (i.e., capacitor) such as an IPD on the first side 20a of the carrier structure 20, the restriction imposed by the underfill 222 on the second side 20b of the carrier structure 20 is prevented. Therefore, the distance between the second electronic component 22 and the IPD (i.e., capacitor) can be reduced according to the needs. As such, the electronic package 6 according to the present disclosure can greatly reduce the parasitic inductance to achieve the optimal operating effect.

Figure 7A:
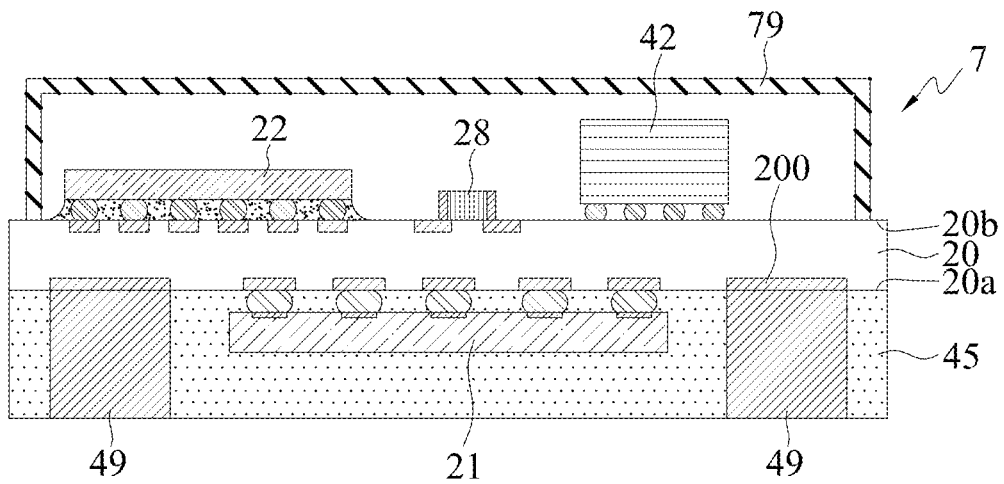
FIGS. 7A and 7B are schematic cross-sectional views illustrating a method of manufacturing an electronic package in accordance with a sixth embodiment of the present disclosure.
Figure 7B:
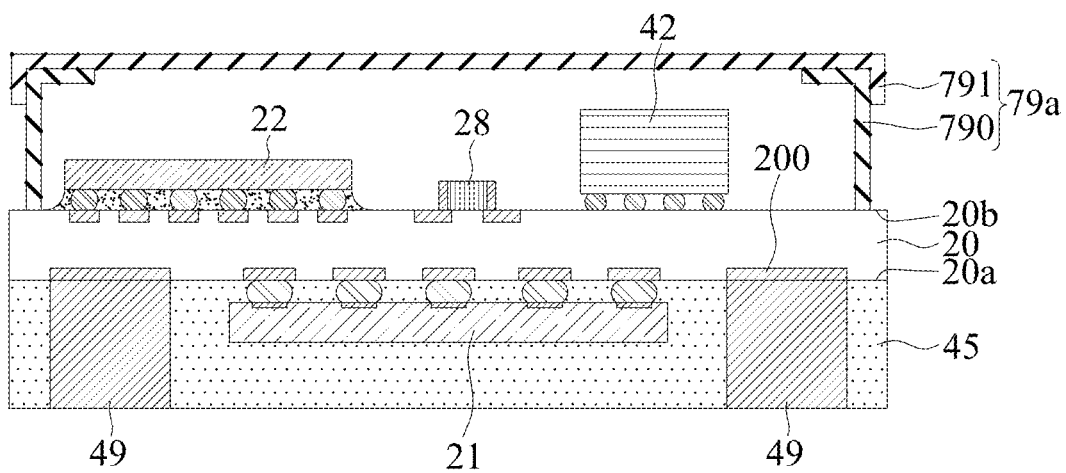

FIGS. 7A and 7B are schematic cross-sectional views of an electronic package 7 in accordance with a sixth embodiment of the present disclosure. The sixth embodiment differs from the third embodiment in the addition of a metal frame, and similarities between the two will not be provided to avoid repetitions.

As shown in FIG. 7A, a metal frame 79 is disposed on the second side 20b of the carrier structure 20 to surround and cover the second electronic components 22, 42 and the passive component 28.

In an embodiment, the metal frame 79 is an integrally formed single independent component. Alternatively, as shown in FIG. 7B, the metal frame 79a is modular, which includes at least one support leg 790 vertically disposed on the carrier structure 20 and a cover 791 disposed on the support leg 790 to surround and cover the second electronic components 22, 42 and the passive component 28.

Therefore, the arrangement of the metal frames 79, 79a according to the manufacturing method of the present disclosure provides shielding effect of the second electronic components 22, 42 and the passive component 28 on electromagnetic interference (EMI), and can also be used as a stiffener to reduce the overall warpage of the electronic package 7.

The present disclosure further provides an electronic package 2, 3, 4, 5, 6, 7, which includes: a carrier structure 20, 50 having a circuit layer 200, 500, at least one conductive structure 29, 29a, 39, 49, 59, an encapsulation layer 25, 45, and at least one second electronic component 22, 42.

The carrier structure 20, 50 has a first side 20a, 50a and a second side 20b, 50b opposite to each other.

The conductive structure 29, 29a, 39, 49, 59 is disposed on the first side 20a, 50a of the carrier structure 20, 50 and electrically connected to the circuit layer 200, 500.

The encapsulation layer 25, 45 is disposed on the first side 20a, 50a of the carrier structure 20, 50 and covers the conductive structure 29, 29a, 39, 49, 59, such that a portion of a surface of the conductive structure 29, 29a, 39, 49, 59 is exposed from the encapsulation layer 25, 45.

The electronic components 22, 42 are disposed on the second side 20b, 50b of the carrier structure 20, 50 and electrically connected to the circuit layer 200.

In an embodiment, the conductive structure 29, 49, 59 includes a conductive pillar 23 bonded to the circuit layer 200. For example, an end face 23b of the conductive pillar 23 is exposed from the encapsulation layer 25, 45. Alternatively, the conductive pillar 23 is bonded to the circuit layer 200, 500 via a conductor 230, 530.

In an embodiment, the electronic package 2 further includes a functional pad 27 embedded in the encapsulation layer 25, and the functional pad 27 is bonded to the circuit layer 200. For example, a portion of a surface of the functional pad 27 is exposed from the encapsulation layer 25.

In an embodiment, the conductive structure 29a includes a solder ball. For example, the solder ball protrudes from the encapsulation layer 25.

In an embodiment, the conductive structure 39 includes a circuit block. For example, the circuit block includes at least one conductive pillar 331 electrically connected to the circuit layer 200. An end face of the conductive pillar 331 is exposed from the encapsulation layer 25. Alternatively, the circuit block includes at least one circuit portion 330 electrically connected with the circuit layer 200, and a portion of a surface of the circuit portion 330 is exposed from the encapsulation layer 25.

In an embodiment, the electronic package 2, 4, 5, 6, 7 further includes a first electronic component 21, 61 embedded in the encapsulation layer 25, 45, and the first electronic component 21 is electrically connected to the circuit layer 200.

In an embodiment, the electronic package 7 further includes a metal frame 79, 79a disposed on the second side 20b of the carrier structure 20, where the metal frame 79, 79a surrounds and covers the second electronic components 22, 42.

In conclusion, the electronic package and the manufacturing method of the present disclosure increase the rigidity of the carrier structure by the encapsulation layer, so there is no need to provide a heat sink, a stiffener or increase the thickness of the carrier structure as in the prior art. This addresses the problems of warpage or wavy deformations that arise from the increased volume of the electronic package due to functional requirements. Thus, compared to the prior art, the electronic package of the present disclosure not only overcomes the problems of warpage or wavy deformations, but also improves electrical performance and heat dissipation capacity and reduces the cost of manufacturing the electronic package and the overall size of the electronic package.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
   a carrier structure having a circuit layer and including a first side and a second side opposite to the first side;
   conductive structures disposed on the first side of the carrier structure and electrically connected to the circuit layer;
   an encapsulation layer formed on the first side of the carrier structure and covering the conductive structures, wherein portions of surfaces of the conductive structures are exposed from the encapsulation layer;
   at least an electronic component disposed on the second side of the carrier structure and electrically connected to the circuit layer; and
   a metal frame disposed on the second side of the carrier structure, wherein the metal frame surrounds and covers the electronic component.

2. The electronic package of claim 1, wherein each of the conductive structures includes a conductive pillar bonded to the circuit layer.

3. The electronic package of claim 2, wherein the conductive pillar has an end face exposed from the encapsulation layer.

4. The electronic package of claim 2, wherein the conductive pillar is bonded to the circuit layer via a conductor.

5. The electronic package of claim 1, further comprising a functional pad embedded in the encapsulation layer, and the functional pad is bonded to the circuit layer.

6. The electronic package of claim 5, wherein a portion of a surface of the functional pad is exposed from the encapsulation layer.

7. The electronic package of claim 1, wherein each of the conductive structures includes a solder ball.

8. The electronic package of claim 7, wherein the solder ball protrudes from the encapsulation layer.

9. The electronic package of claim 1, wherein each of the conductive structures includes a circuit block.

10. The electronic package of claim 9, wherein the circuit block includes at least one conductive pillar electrically connected to the circuit layer, and wherein the conductive pillar has an end face exposed from the encapsulation layer.

11. The electronic package of claim 9, wherein the circuit block includes at least one circuit portion electrically connected to the circuit layer, and wherein a portion of a surface of the circuit portion is exposed from the encapsulation layer.

12. The electronic package of claim 1, further comprising another electronic component embedded in the encapsulation layer and electrically connected to the circuit layer.

13. An electronic package, comprising:
   a carrier structure having a circuit layer and including a first side and a second side opposite to the first side;
   conductive structures disposed on the first side of the carrier structure and electrically connected to the circuit layer, wherein each of the conductive structures includes a circuit block;
   an encapsulation layer formed on the first side of the carrier structure and covering the conductive structures, wherein portions of surfaces of the conductive structures are exposed from the encapsulation layer; and at least an electronic component disposed on the second side of the carrier structure and electrically connected to the circuit layer.

14. The electronic package of claim 13, wherein the circuit block includes at least one conductive pillar electrically connected to the circuit layer, and wherein the conductive pillar has an end face exposed from the encapsulation layer.

15. The electronic package of claim 13, wherein the circuit block includes at least one circuit portion electrically connected to the circuit layer, and wherein a portion of a surface of the circuit portion is exposed from the encapsulation layer.

16. An electronic package, comprising:
a carrier structure having a circuit layer and including a first side and a second side opposite to the first side;
conductive structures disposed on the first side of the carrier structure and electrically connected to the circuit layer;
an encapsulation layer formed on the first side of the carrier structure and covering the conductive structures, wherein portions of surfaces of the conductive structures are exposed from the encapsulation layer;
at least an electronic component disposed on the second side of the carrier structure and electrically connected to the circuit layer; and
a metal stiffener disposed on the second side of the carrier structure.

17. An electronic package, comprising:
a carrier structure having a circuit layer and including a first side and a second side opposite to the first side, wherein a groove is formed on the first side of the carrier structure;
conductive structures disposed on the first side of the carrier structure and electrically connected to the circuit layer;
an encapsulation layer formed on the first side of the carrier structure and covering the conductive structures, wherein portions of surfaces of the conductive structures are exposed from the encapsulation layer;
at least an electronic component disposed on the second side of the carrier structure and electrically connected to the circuit layer; and
another electronic component disposed in the groove and electrically connected to the circuit layer.

* * * * *